(12) United States Patent
Ivanov et al.

(10) Patent No.: US 6,872,284 B2
(45) Date of Patent: Mar. 29, 2005

(54) TARGET AND METHOD OF OPTIMIZING TARGET PROFILE

(75) Inventors: Eugene Y. Ivanov, Grove City, OH (US); David B. Smathers, Columbus, OH (US); Charles E. Wickersham, Jr., Columbus, OH (US); Lin Zhu, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 10/312,050

(22) PCT Filed: Feb. 20, 2002

(86) PCT No.: PCT/US02/04819

§ 371 (c)(1),
(2), (4) Date: Apr. 29, 2003

(87) PCT Pub. No.: WO02/086186

PCT Pub. Date: Oct. 31, 2002

(65) Prior Publication Data

US 2003/0183506 A1 Oct. 2, 2003

Related U.S. Application Data

(60) Provisional application No. 60/286,182, filed on Apr. 24, 2001, provisional application No. 60/296,354, filed on Jun. 6, 2001, and provisional application No. 60/300,019, filed on Jun. 21, 2001.

(51) Int. Cl.[7] .......................... C23C 14/34; G01N 33/00
(52) U.S. Cl. ............................ 204/192.13; 204/298.13; 427/8; 73/866
(58) Field of Search ...................... 204/298.13, 192.13; 427/8; 73/866

(56) References Cited

U.S. PATENT DOCUMENTS

| 4,995,958 A | 2/1991 | Anderson et al. ......... 204/298.2 |
| 5,248,402 A | 9/1993 | Ballentine et al. ....... 204/298.2 |
| 5,252,194 A | 10/1993 | Demaray et al. ......... 204/298.2 |
| 5,830,327 A | 11/1998 | Kolenkow ............. 204/192.12 |
| 5,863,399 A | 1/1999 | Sichmann ............. 204/298.12 |
| 6,299,740 B1 | 10/2001 | Hicronymi et al. .... 204/192.12 |

FOREIGN PATENT DOCUMENTS

DD 239807 A1 10/1986 ........... C23C/14/36

OTHER PUBLICATIONS

The Design of Rotating Magnet Sputter Sources; Robert J. Kolenkow, Craig Armstrong.
Enhanced Targets Can Reduce Metallisation Cost of Ownership—A Case Study; Thomas Meidlinger, Daniel R. Marx, Jean–Pierre Blanchet; Semiconductor Fabtech—12th Edition, pp. 255–264.

Primary Examiner—Steven Versteeg
(74) Attorney, Agent, or Firm—Wegman Hessler & Vanderburg (57) ABSTRACT

A method of constructing increased life sputter targets and targets made by the method are disclosed. The method comprises starting with a precursor target design or profile and making magnetic field strength measurements along the radial surface of same and at a plurality of vertical dimensions above the surface. An optimal magnetic field strength ratio is provided between the erosion tracks of the target. The vertical dimension of the material to be added to one of the erosion tracks is determined and then the height of the other erosion track is calculated by utilizing this optimal magnetic field strength ratio.

19 Claims, 5 Drawing Sheets

TARGET AND METHOD OF OPTIMIZING TARGET PROFILE

CROSS-REFERENCE TO RELATED APPLICATIONS

Priority filing benefit of (1) International PCT application PCT/US02/04819 filed Feb. 20, 2002, and published under PCT 21(2) in the English language; (2) U.S. provisional application Ser. No. 60/286,182 filed Apr. 24, 2001; (3) U.S. provisional application Ser. No. 60/296,354 filed Jun. 6, 2001; (4) U.S. provisional application Ser. No. 60/300,019 filed Jun. 21, 2001; and (5) U.S. provisional application Ser. No. 60/328,847 filed Oct. 11, 2001.

BACKGROUND OF THE INVENTION

In a commercial physical vapor deposition (PVD) system, the lifetime of a sputtering target is usually designed by the original equipment manufacturer (OEM). Such a lifetime, usually defined as a sputtering power times sputtering time (kilowatt-hours) or as the total thickness of material deposited on the substrates (microns, or number of 1 micron depositions), is mainly determined by the sputtering target material, target geometry and cathode magnet design. The sputtering cathode assembly is optimized for its performance parameters, such as deposition uniformity for the given design.

Target uniformity performance is determined mainly by the following three factors: the erosion profiles of the target during sputtering, target crystallographic texture, substrate to target distance, and the gas scattering factor during the deposition process. The erosion profile is the most important factor in determining the deposition uniformity. It also remains largely unchanged for a given PVD system.

In a PVD process, a cloud of plasma is present in front of the sputtering target. This plasma is sustained by the magnetic field from the magnets behind the sputtering target. The density of the plasma and, hence, the rate of sputtering of the target is related to the magnetic field strength at the target surface. Electrical-magnetic theory indicates that the maximum sputtering rate occurs when the vertical component of the magnetic field is zero and the horizontal component of the magnetic field is at maximum. In the following, the term "magnetic field" refers to the horizontal component of the magnetic field when the vertical magnetic field is near zero if it is not otherwise indicated.

In an advanced magnetron PVD design, the cathode magnet usually consists of an array of small magnets rotating around a target center axis to give better uniformity performance. At different locations on the target surface the magnetic field strength and the average residence time of the magnetic field per revolution of the magnets vary. Both of these variations contribute to the existence of different sputtering rates at different locations on the target surface, hence the existence of the target sputtering profile (sputtering grooves). We define the time integration of the magnetic field strength within a revolution as time averaged magnetic field strength (T-B-Field). In a commercial PVD system, the OEM usually designs the configuration of the cathode magnet assembly to form the desired T-B-Field. This, in turn, creates the desired target surface erosion profile that is adapted to achieve optimal deposition uniformity performance. Methods for determining desired magnet configuration and target erosion profiles may be seen upon review of U.S. Pat. Nos. 4,995,958; 5,314,597; 5,248,402; 5,830,327; and 5,252,194.

DESCRIPTION OF THE INVENTION

There are situations where a longer target utilization lifetime is desired. The simplest way to try to accomplish this is to increase the thickness of the sputtering target. However, since the cathode assembly is optimized for the designed thickness, an increase of thickness might cause the deterioration of the deposition uniformity. In a recent test, a 13% increase of target thickness caused the target deposition uniformity to change from 0.7% to 1.18% at 1 σ. The thin film resistance contour map (Omni-map) shows that less material was sputtered from the center of the target as compared to the outer edge of the target, i.e., the sputtered thin film was thinner at the wafer center than at the wafer edge. We discovered that this change was due to the fact that the T-B-Field at the center and at the edge no longer held their proper ratio when the target thickness was increased. In order to sustain the deposition uniformity performance, we found that the target thickness at different erosion groove locations had to be changed in order to bring the local T-B-Field back to the proper ratio.

The method below describes how to find the proper profile (shape) of an increased thickness target in order to achieve the goal of increasing target life while maintaining target uniformity performance. For any given sputtering target configuration, our method involves the following steps:

A) Measuring the existing target sputtering profile and determining the maximum erosion groove locations.

B) Measuring the vertical and horizontal magnetic field strength at different radial locations of the target surface. Since the magnetic assembly is rotating, this measurement has to be carried out dynamically. This can be accomplished by using two or three B-field probes to measure the magnetic field strength at any location on the target surface at three different orthogonal directions simultaneously. The results of the B-field probes can then be fed to a digital oscilloscope, and the results of the dynamic magnetic field strength at different directions can then be calculated at any location of the target surface. Additional measurements are taken at different radial locations on the target surface.

C) Continuing the same measurements as in B) at different heights above the target surface. The measurements should exceed the height equal to the intended increase of target thickness.

D) Recording or plotting the graph of the T-B-Field vs. radial locations at different heights above the target surface. (This step could be completed in a computer or other memory means.)

E) Determining the ratio of the T-B-Field at each erosion groove location relative to the location of the deepest groove at the target surface level.

F) Determining the ratio of the T-B-Field at each erosion groove location to the location of the deepest groove at the height equal to the increased target thickness level.

G) Determine the change needed of the height at each groove location so that the ratio in F) will match the ratio in E).

From the difference of local height and width of each groove obtained in G), the extended life target profile can then be designed.

The invention will be further described in conjunction with the appended drawings and remaining description.

DETAILED DESCRIPTION OF THE PREFERRED EMBODIMENT

Figure 1:
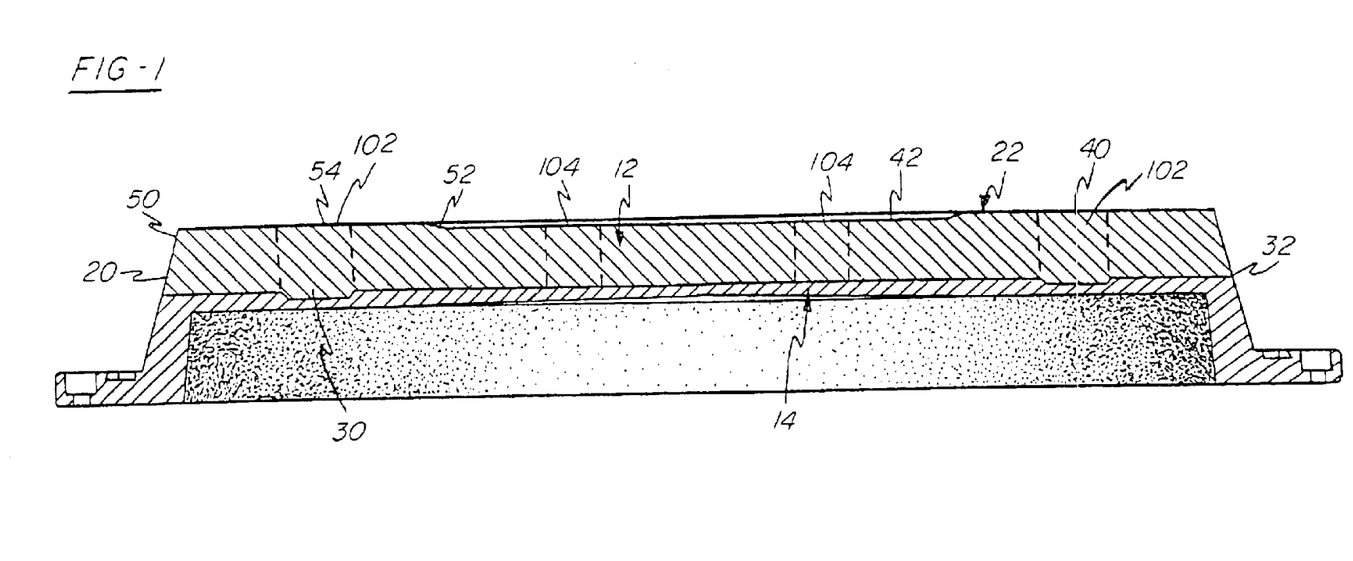
FIG. 1 is a cross-sectional view of a dual erosion track target/backing plate assembly that can be designed in accordance with the invention.

Turning now to FIG. 1 there is shown an exemplary target that may be enhanced by the instant method so as to result in a greater target thickness to increase sputtering life without deleteriously affecting sputtering performance. The particular target shown is adapted for a type "B" ENDURA® sputtering system.

Target 12 may, for example, comprise Al with backing plate 14 comprising Al or Cu. Alloys of these metals may also be noted as exemplary materials. Most preferably, the target 12 is bonded to the backing plate 14 in accordance with the disclosure of commonly-assigned PCT International Application WO 00/15863, its corresponding U.S. patent application Ser. No. 09/720,347, filed Dec. 21, 2000, the disclosures of which are incorporated herein by reference.

The preferred target 12 is generally frusto-conical in shape, being circular in plan and possessing side walls 20 which converge in a generally linear fashion in the direction of a sputtering surface 22. In cross-section, the preferred target 12 and backing plate 14 have the overall configuration of a frustum, with the backing plate 14 serving as the base of the cone and the target side walls 20 serving as the mid-position of the cone, such that the side walls 20 would approach an apex of the cone if the side walls 20 were extended beyond the sputtering surface 22.

A thickened area or circular boss 30 is formed along the target/backing plate interface 32. This thickened area 30 serves to increase target life by acting as an erosion track extension or the like. In the embodiment illustrated, the radial dimension of this thickened area 30 is preferably about 3.047 inch (~7/74 cm) and the depth is preferably about 0.050 inch (~1.3 mm).

The sputtering surface 22 includes an outer, stepped-up or elevated terrace area 40 of increased target thickness surrounding a shallow well 42 defining a thinner, central region of the target 12. The terrace 40 comprises an outer wall 50 and an inner wall 52. The inner wall 52 slopes outwardly from the well toward a plateau or outer surface 54 of the terrace at an angle of about 13.5° in the particular embodiment that is depicted. The inner wall 52 has a length or radial dimension of about 0.25 inch (~6.4 mm). As shown, the surface of the terrace 40 is raised about 0.060 inch from the surface of the well. The terrace 40 provides additional material thickness in a region of the sputtering surface 22 where high erosion can be anticipated.

The target shown in FIG. 1 is known as a dual erosion track target wherein the target comprises an outer erosion track 102 and inner erosion track 104 shown in phantom in FIG. 1 (as can also be seen in the profile shown in FIG. 3) with these tracks disposed generally in an annulus around the target. In the view shown in FIG. 1, the outer erosion track is defined as the vertical distance between the top surface of the terrace 40 and bottom of the thickened portion 30 of the target with the inner erosion track contained in the region of the target circumscribed by well 42 and having a vertical distance measured from the bottom of the target to the top of the well.

In general, the methods of the instant application can be employed to provide enhanced sputtering life to the target by providing optimized increase of the height of the erosion tracks.

From the data now available to us it appears that there are a few parameters that limit the vertical or height extension that can be made to existing standard targets. Initially, in order to promote effective sputtering, the time averaged magnetic field strength must approximate about 200 gauss at the target surface area so that the desired plasma configuration can be formed along the target surface. Additionally, the physical spatial limits of the sputtering system provide an upper limit to the desired height increase of the target.

Lastly, and most importantly, the sputtering uniformity of the increased height targets must be similar or better at a 1 σ confidence level to the uniformity achieved by the present standard height targets. That is, a uniformity of less than about 1% at 1 σ should be achieved.

It is to be noted that the principles of the instant invention are thought applicable to any type of PVD system where the plasma configuration is magnetically controlled and which results in a target erosion profile having two or more erosion tracks. For instance, Endura® systems available from Applied Materials, Quantum™ systems from Novellus and Ulvac® systems from Ulvac® may all be mentioned as exemplary.

The goal then is to take a standard target or predicted target profile that presumably already has a desired or optimized sputter track configuration and known vertical height dimensions for the erosion tracks. From the precursor profile we can then confidently increase the height of the erosion tracks to make the target thicker without diminishing sputter performance.

Figure 2:
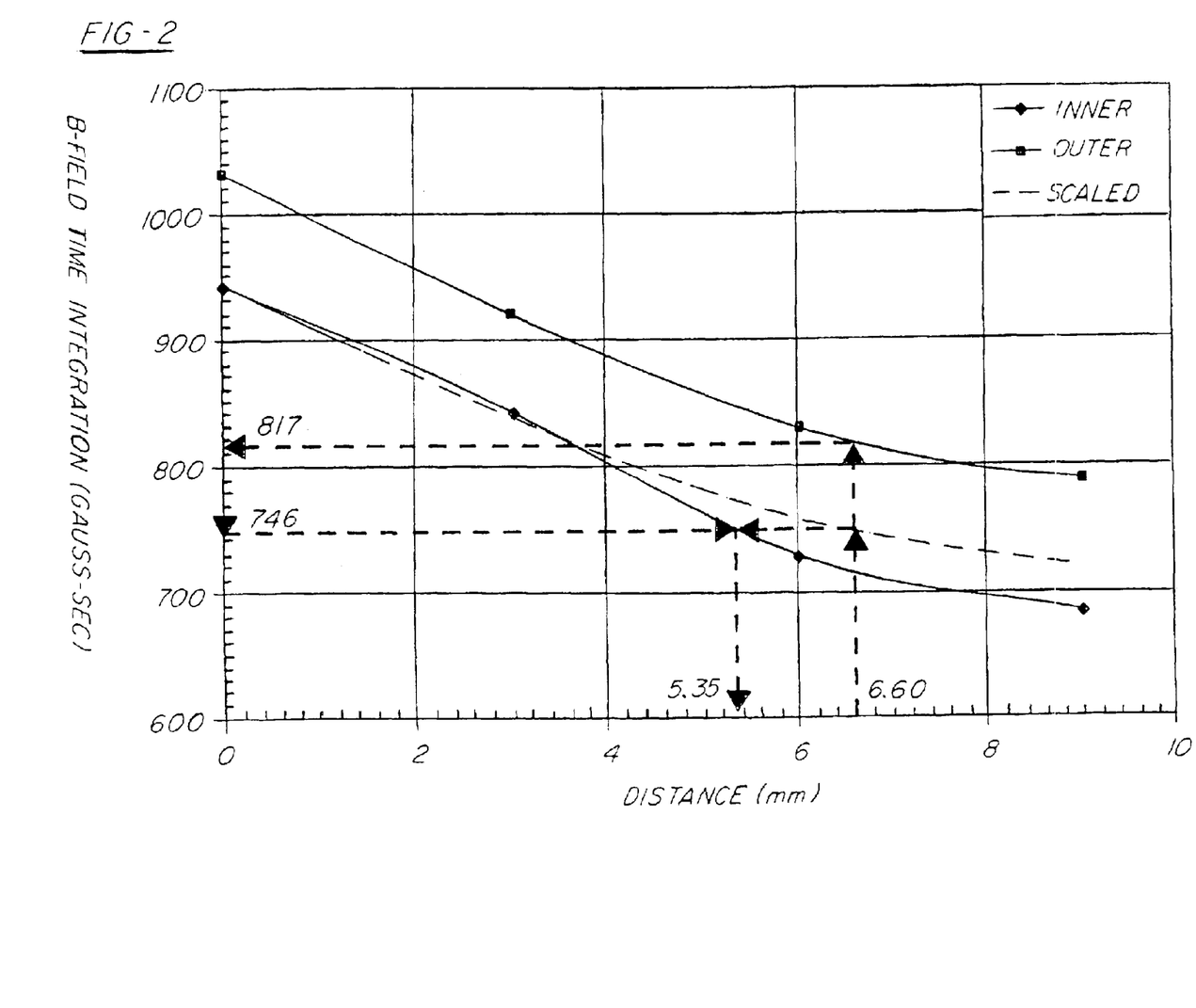
FIG. 2 is a graph showing time integrated magnetic field strengths vs. increased vertical distance or increased height of the target material compared to a standard target profile.

Turning now to FIG. 2, there is shown a graph plotting the B-Field Time Integration (T-B-Field) values in Gauss-sec for vertical spaces over the standard target in those radial locations which correspond to the outer erosion track and inner erosion track. It can be seen that for the standard target, designated as 0 mm, the field strength measured at the outer erosion track of the purportedly optimized target is 1030 gauss-sec and the magnetic field strength at the inner erosion track is 940 gauss-sec.

Thus, in accordance with the invention, it will be desirable to maintain this ratio of outer erosion track magnetic field density (OETGS)/inner erosion track magnetic field density (IETGS), i.e., (OETGS):(IETGS), at an approximate constant ratio.

Here, for the particular system tested, the most preferred OETGS/IETGS ratio is 1.095. This is seen by comparing the OETGS and IETGS values along the y-axis with x=0. Thus, a preferred range for OETGS/IETGS ratio for this particular system would be about 1.00–1.20:1.

If the artisan then desires to increase the thickness of the outer erosion track area by 6.60 mm as per FIG. 2, the anticipated OETGS will be 817 gauss-sec. If the optimum OETGS/IETGS ratio of 1.095 is to be maintained, then the IETGS must be 746 gauss-sec. This means that the height of the inner erosion track must be increased by 5.35 mm leaving a 1.25 mm distance between the two erosion tracks. This would correspond to a 1.25 mm difference between the height of the terrace 40 shown in FIG. 1 and the height of the well 42.

Figure 4:
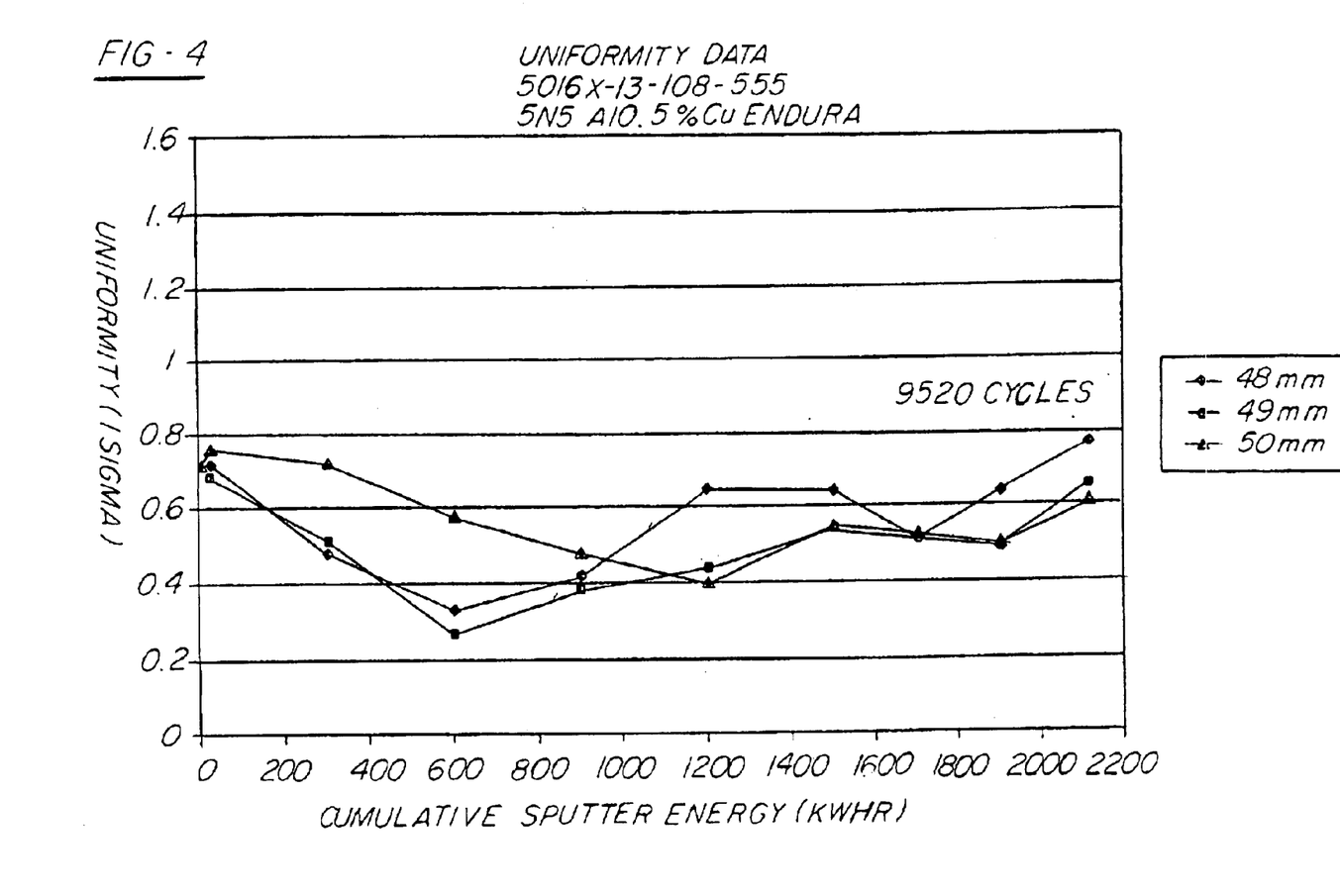
FIG. 4 is a sputtering uniformity data graph showing sputtering uniformity and increased sputter energy lives (in kwhr) for increased thickness targets designed and made in accordance with the invention.

Stated differently, for the two groove target shown in FIG. 1, the T-B-Field at the inner and outer groove locations are measured at different heights. For the desired increase of 6.60 mm of target thickness, a 0.05" deep pocket has to be cut at the location of the inner groove in order to maintain the same T-B-Field ratio as in the standard target or the purported optional profile configuration. This increased height target was tested in an Endura® sputtering system and resulted in a 100% increase in sputter life with the same deposition uniformity demonstrated by the standard target. Results can be seen in FIG. 4.

The following example demonstrates one method by which a desired target sputtering profile may be generated. It is to be understood that this example illustrates only one method by which a desired target sputtering profile may be generated. Additional methods involve using an existing target that purportedly has optimal erosion track dimensions and configuration. Also, a multiplicity of target configurations can actually be test sputtered so that by trial and error a specific configuration can be obtained that is thought to be optimum. This target design then is the starting configuration or precursor configuration that is optimized in accordance with the invention by increasing the vertical dimension or height of the target material in the erosion tracks. Additionally, a variety of mathematical formulae may be used to predict erosion track configurations such as those set forth in the prior art U.S. patents listed above.

EXAMPLE ONE (A) A target adapted for use in the Quantum™ sputtering system was mounted with target surface up. The magnets were rotated as during sputtering. Two Hall-Effect Gauss Probes were mounted on a sliding micrometer to cover all radial locations of the target. Another micrometer was used to adjust the height of the probes to cover all five height positions used in this study. The Hall Effect Gauss probe could then measure the magnetic field of the Quantum™ source in Radial (R), Tangential (T) and Vertical (Z) directions.

(B) We used two Gauss Probes to measure simultaneously the dynamic magnetic field strength of the Quantum™ source in Radial (R)/Tangential (T) and Radial (R)/Vertical (Z) directions. Because of the low frequency of the signal (~1 HZ), the two pairs of measurements were not synchronized. However, within a measurement, the two channels were synchronized. We measured the magnetic fields at 30 different radial locations and at 5 different heights from the target surface. At each location there are four channels of data (R, T and R, Z) and each channel contains 40,000 data points. All of the two channel wave forms were displayed in a two-channel Tektronix Oscilloscope and the synchronized two-channel data were exported to a PC.

(C) For each radial location and each height, the recorded four channels of data were inputted into an Excel® Spread sheet. Then the data were condensed by factor of 10 by simply averaging every 10 data points into one data point. A conversion factor was also incorporated to compensate for the different magnification for each channel. Then the four channels of condensed data were stored into a new data set.

(D) For each new data set, the two R data series were plotted in Excel® and the specific time shift was determined for each two pairs of data series. Then the R/Z data group was shifted by the correct amount of time to merge together with the R/T group. Now the R, T and Z series were all synchronized. The R and T channel data were then vector-added to form the parallel B-field (B-p) strength. A new file was created for this synchronized B-p and Z data series.

(E) For each B-p and Z series, each B-field value was time-gated as following: (1) The absolute value of the Z field must be less than a preset parameter (150 Gauss in this report) and, (2) The B-p value must be more than another preset parameter (50 Gauss is this study). The gated B-field strengths were then integrated within a revolution period to obtain the relative Time-Integration Average for the parallel B-field strength when the vertical B-field were near zero (T-B-Field).

Figure 3:
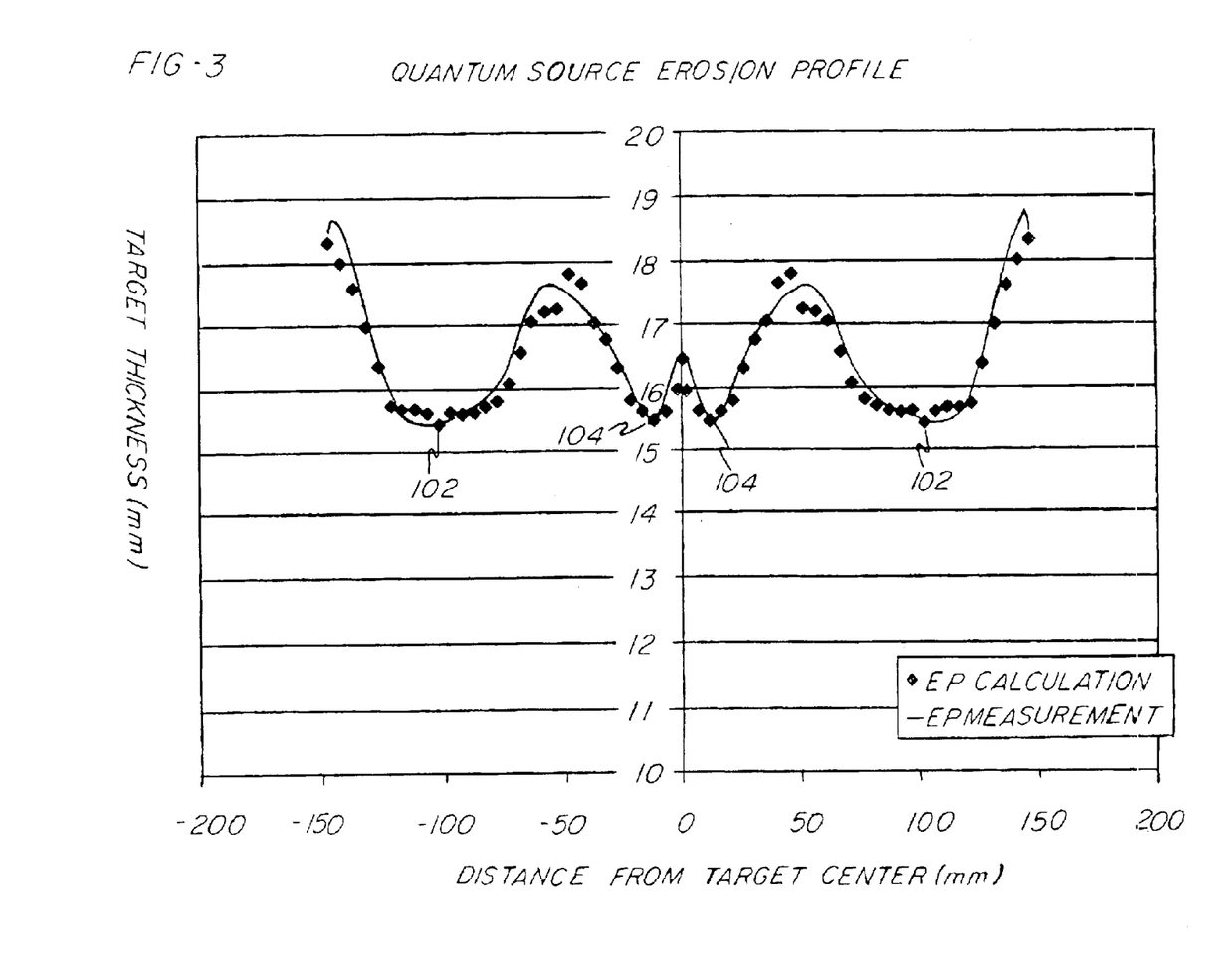
FIG. 3 is an erosion profile calculated by the methods reported in the example set forth in the description.

(F) For the first order approximation, this T-B-Field result should be proportional to the sputtering rate at that location. These results were plotted and scaled against a real measured Erosion Profile. This graph is shown in FIG. 3. The reference numerals 102, 102 show what has been referred to as the outer erosion track with the inner erosion track given reference number 104, 104.

The instant method may be utilized to construct plural or even multiple erosion track magnetron sputtering targets. The first step is to provide a desired precursor sputtering target configuration having what is thought to be optimal profile for uniform sputtering performance. The phrase "sputtering target configuration" should be construed to cover not only existing targets themselves that are thought to have optimized or have standard construction, but also computer generated or mathematically derived profiles or configurations. The precursor sputtering target configuration may, for example, be obtained from inspection of existing sputtering targets or, such profiles can be determined via actual sputtering of a plurality of sputtering target samples with the optimal profile then being decided by trial and error. Once the precursor sputtering target configuration is obtained, the location of the erosion tracks may be determined.

In accordance with one aspect of the invention, the desired precursor sputtering target configuration is obtained by making magnetic field strength measurements at a variety of radial locations along the sputtering surface and by making the same magnetic field strength measurements at a plurality of vertical dimensions above those radial locations. The erosion tracks are correlated to those measurements.

Once a desired precursor sputtering target configuration has been obtained, magnetic field strength measurements are made at a variety of different radial locations RL along the sputtering surface of the precursor sputtering target profile. Due to the rotation of the magnetron assembly, a time-averaged magnetic field strength is obtained for the radial points on the target surface located at the erosion track locations.

An optimum ratio range for the magnetic field strengths as measured at these radial locations corresponding to the erosion tracks is then determined; namely, OETGS/IETGS. This optimum ratio range will, of course, vary from sputtering system to sputtering system. We have found that for the particular Endura® system, the outer to inner erosion track ratio should be on the order of about 1.00–1.20:1. The preferred magnetic field strength ratio of the outer to inner erosion track in this system is 1.095:1.

Magnetic field strength data points are then obtained for a variety of vertical dimensions V located above the different radial locations RL over the erosion tracks E-1 and E-2. These data points are identified as VE-1 and VE-2.

All of this data may then be recorded in a memory media such as a computer or on graph papers, etc. The data points may, for example, be plotted on a graph with one axis of the graph including the magnetic field strengths and the other axis reporting the VE-1 and VE-2 vertical height dimensions at which such magnetic field strengths were measured.

Then, the desired increase in vertical dimension for the sputtering material to be located at one of the erosion tracks is determined. The magnetic field strength for such increased vertical dimension is then determined and the magnetic field strength for the other erosion track is then determined utilizing the optimal ratio range for magnetic field strengths existing at erosion track locations RE-1 and RE-2. Once this value has been obtained, the artisan can then determine the desired increase in vertical dimension or height for the sputtering material to be applied or added to the other erosion track. Of course, after the determination of the vertical extension for each of the erosion tracks is determined, a sputter target in accordance with those dimensions is constructed.

Figure 5:
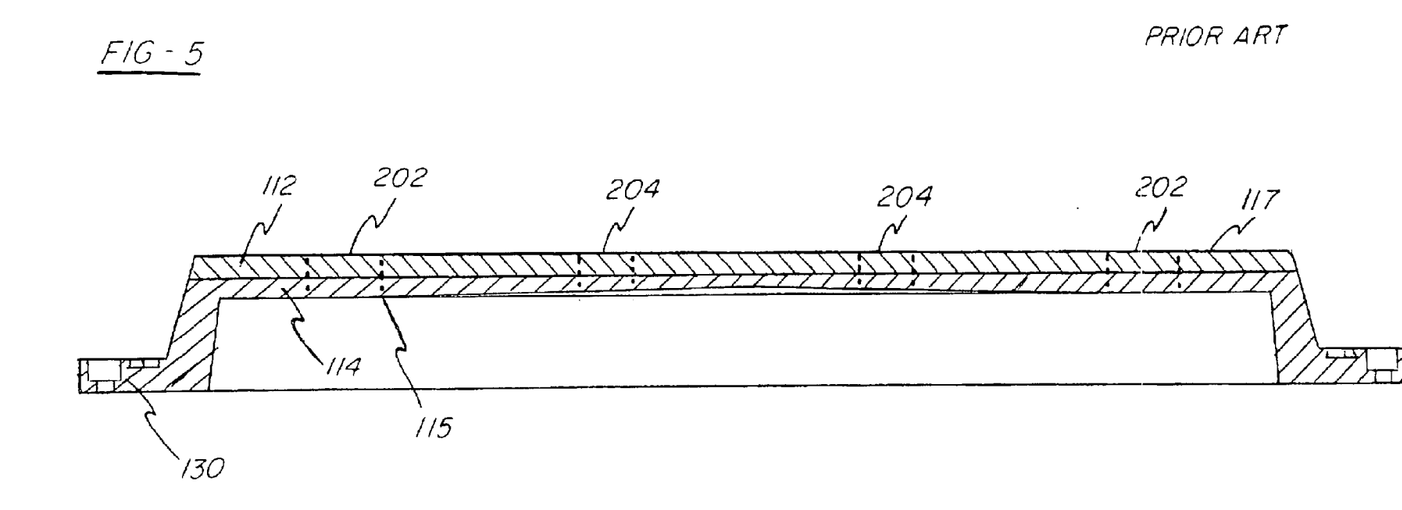
FIG. 5 is a cross-sectional view of a prior art dual erosion track target/backing plate assembly.

Turning now to FIG. 5, there is shown a prior art or standard target/backing plate assembly. The thickness of the target in this assembly can be optimally increased in accordance with the invention while the erosion track heights are optimally balanced by use of the magnetic field strength ratio method above described; all resulting in an enhanced life, uniformly sputtering target of the type shown in FIG. 1.

The prior art assembly may comprise a distinct target structure bonded over a backing plate or the assembly can be monolithic. As shown, the prior art assembly comprises target 112 bonded over backing plate 114. In conventional manner, the lower side 115 of the backing plate is adapted for heat exchange contact with a cooling medium, typically water.

Note that in the FIG. 1 target, no recess or well area is formed along the top 117 or sputtering surface of the target. Two distinct annular erosion tracks 202, 204 do exist in the target, due primarily to the revolution of a specifically designed magnet array under the surface 115.

The overall height (h) of the assembly of FIG. 1 including the backing plate (and its associated mounting flange 130) and the target is 1.9". The thickness of the target itself (i.e., vertical distance from backing plate to the top of the sputtering surface) is 0.772" with the backing plate thus having a height of 1.128".

In accordance with the invention, and with respect to the FIG. 1 assembly, we have constructed an effective target/backing plate assembly having an overall height of 2.16", whereby the target thickness (as measured from the target/backing plate interface 32 to the top of the surface of terrace 40) is 1.032". The backing plate thickness here is 1.128" same as for the standard target. Thus, the difference in target thickness between the specific embodiment of the invention shown herein in FIG. 1 and the standard or FIG. 5 target is 0.26" (or 6.6 mm).

The method described previously is then used to calculate the thickness needed for the inner erosion track (note FIG. 2 herein). By this method, a recess of 1.25 mm is calculated and this recess is formed by machining the target surface to form the recess or well 42.

Both of the targets shown in FIGS. 1 and 5 have a diameter of 15.620" with the sputtering surface of each of the targets having a diameter of 12.394".

The sputter targets in accordance with the invention thus have thicknesses greater than the standard thickness of 0.772". Additionally, these targets in accordance with the invention are characterized by having time-averaged magnetic field strength ratios, as previously discussed, of RE-1:RE-2 of from about 1.00-about 1.20:1. More specifically, and as set forth in the example above, the RE-1:RE-2 ratio of 1.095:1 is presently preferred in conjunction with targets adapted for utilization in conjunction with the Endura® sputtering systems.

Turning back to FIG. 1, the thickness of the terrace area of the target in this embodiment is about 1.032" with the thickness of the well 42 of the target shown equaling about 0.972". Accordingly, the well is recessed from the terrace in an amount of 0.060". However, the artisan will appreciate that the well surface could be recessed from the terrace by a dimension of about 0.04–0.075", more preferably in accordance with the above method by about 0.05-about 0.06".

The thickness of the entire assembly of backing plate and target or monolithic assembly is greater than about 1.9" in accordance with the invention and the erosion tracks E-1 and E-2 located on the target will exhibit time-averaged magnetic field strengths of RE-1:RE-2 of from about 1.00-about 1.20:1.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A method of determining a desired thickness of plural erosion tracks in a magnetron sputtering target comprising:
    a) providing a desired precursor sputtering target configuration having a specified sputtering surface and determining the location of said erosion tracks, E-1 and E-2, thereon;
    b) determining the magnetic field strength at different radial locations RL along the sputtering surface of said precursor sputtering target configuration and determining a time averaged magnetic field strength for points on said erosion tracks, RE-1 and RE-2;
    c) determining an optimum ratio range for said magnetic field strengths RE-1 and RE-2 determined in (b);
    d) determining magnetic field strengths at vertical dimensions V above said erosion tracks E1 and E2 such that data points VE1 and VE2 are generated;
    e) recording the magnetic field strengths for said vertical dimensions VE1 and VE2;
    f) determining a desired increase in vertical dimension for sputtering material at one of said erosion tracks E1 or E2; and then
    g) determining the desired vertical height for sputtering material to be added to said sputtering surface at said other erosion track.

2. A method as recited in claim 1 wherein said step e) comprises plotting a graph showing magnetic field strengths for a plurality of vertical dimensions.

3. A method as recited in claim 1 wherein said step e) comprises recording data for said magnetic field strengths for said vertical dimensions VE1 and VE2 in a memory media.

4. A method as recited in claim 3 wherein said memory media comprises a computer.

5. A method as recited in claim 1 wherein said step a) comprises providing a sample sputtering target to serve as said precursor sputtering target configuration.

6. A method as recited in claim 1 wherein said step a) comprises determining said precursor sputtering target configuration by measuring the magnetic field strengths above a sample sputtering target at a plurality of radial locations along the sputtering surface of said target and at a plurality of vertical dimensions above the target surface.

7. A method as recited in claim 1 wherein said step g) comprises utilizing said optimum ratio range determined in said step c) and calculating the desired magnetic field intensity for said other erosion track.

8. A method as recited in claim 1 wherein said optimum ratio range for said magnetic field strengths at erosion tracks RE-1 and RE-2 is about 1.00–1.200:1 RE-1:RE-2.

9. A method as recited in claim 8 wherein said magnetic field strength ratio RE-1:RE-2 is about 1.095:1.

10. A method as recited in claim 1 wherein said magnetron sputtering target comprises a multiplicity of erosion tracks.

11. Sputter target having a sputtering surface with erosion tracks E-1 and E-2 located thereon and having a sputter target thickness of h; wherein h>0.772", said target having a time averaged magnetic field strength of RE-1 for points on said erosion track E-1 and a time averaged magnetic field strength of RE-2 for points on said erosion track E-2 such that RE-1:RE-2 is from about 1.00-about 1.20:1.

12. Sputter target as recited in claim 11 wherein RE-1:RE-2 is about 1.095:1.

13. Sputter target as recited in claim 11 wherein said E-1 and E-2 each have a thickness of TE-1 and TE-2, respectively, wherein TE-1 is about 1.032" and TE-2 is about 0.972".

14. Sputter target assembly having a sputtering surface and a backing plate surface opposed from said sputtering surface and adapted for contact with a heat exchange medium, said assembly having a thickness of greater than about 1.9", said sputtering surface including erosion tracks E-1 and E-2 located thereon, said target having a time averaged magnetic field strength of RE-1 for points on said erosion track E-1 and a time averaged magnetic field strength of RE-2 for points on said erosion track E-2 such that RE-1:RE-2 is from about 1.00-about 1.20:1.

15. Sputter target as recited in claim 14 wherein RE-1:RE-2 is about 1.095:1.

16. A sputter target comprising a body of generally frusto-conical form including a sputtering surface, said sputtering surface including a thickened annular terrace area surrounding a well, said well having a surface recessed from said terrace by about 0.04–0.075", wherein said sputtering surface comprises a time averaged magnetic field strength of RE-1 for points on said terrace and a time average magnetic field strength of RE-2 for points of said well such that RE-1:RE-2 is from about 1.00–1.20:1.

17. A sputter target as recited in claim 16 wherein said well surface is recessed from said terrace by about 0.05-about 0.06".

18. Sputter target as recited in claim 16 wherein said terrrace has a thickness of greater than about 0.772".

19. A sputter target as recited in claim 16 wherein RE-1:RE-2 is about 1.095:1.

* * * * *

UNITED STATES PATENT AND TRADEMARK OFFICE
CERTIFICATE OF CORRECTION

PATENT NO. : 6,872,284 B2  
DATED : March 29, 2005  
INVENTOR(S) : Eugene Y. Ivanov It is certified that error appears in the above-identified patent and that said Letters Patent is hereby corrected as shown below:

<u>Title page,</u>  
Item [62], Related U.S. Application Data, please add the following provisional application -- 60/328,847 filed October 11, 2001 --

Signed and Sealed this

Twenty-eighth Day of June, 2005

JON W. DUDAS  
*Director of the United States Patent and Trademark Office*